(12) United States Patent
Tseng et al.

(10) Patent No.: US 7,755,641 B2
(45) Date of Patent: Jul. 13, 2010

(54) METHOD AND SYSTEM FOR DECIMATING AN INDEXED SET OF DATA ELEMENTS

(75) Inventors: Steven Tseng, Fremont, CA (US); Chris Tsang, Fremont, CA (US)

(73) Assignee: Broadcom Corporation, Irvine, CA (US)

( * ) Notice: Subject to any disclaimer, the term of this patent is extended or adjusted under 35 U.S.C. 154(b) by 1752 days.

(21) Appl. No.: 10/217,973

(22) Filed: Aug. 13, 2002

(65) Prior Publication Data

US 2004/0034641 A1    Feb. 19, 2004

(51) Int. Cl.
*G09G 5/06*    (2006.01)

(52) U.S. Cl. .................. 345/601; 345/555; 345/602; 345/581

(58) Field of Classification Search .......... 345/240, 345/204, 601, 602, 581, 555; 382/298, 166
See application file for complete search history.

(56) References Cited

U.S. PATENT DOCUMENTS

| | | | |
|---|---|---|---|
| 4,484,187 A | | 11/1984 | Brown et al. |
| 4,853,681 A | * | 8/1989 | Takashima ............ 345/592 |
| 4,999,626 A | * | 3/1991 | Asghar et al. ......... 341/126 |
| 5,146,592 A | * | 9/1992 | Pfeiffer et al. ........ 715/807 |
| 5,172,227 A | * | 12/1992 | Tsai et al. ........... 375/240.2 |
| 5,278,678 A | * | 1/1994 | Harrington ............ 358/518 |
| 5,319,473 A | * | 6/1994 | Harrington ............ 358/501 |
| 5,455,681 A | * | 10/1995 | Ng .................... 358/3.01 |
| 5,455,782 A | * | 10/1995 | Young et al. ......... 708/313 |
| 5,606,632 A | * | 2/1997 | Matsumoto et al. .... 382/298 |
| 5,710,780 A | * | 1/1998 | Thiruvengadam ...... 714/732 |
| 5,778,102 A | * | 7/1998 | Sandford et al. ...... 382/251 |
| 5,894,300 A | * | 4/1999 | Takizawa ............. 345/601 |
| 5,930,387 A | * | 7/1999 | Chan et al. ........... 382/166 |
| 5,991,788 A | * | 11/1999 | Mintzer .............. 708/622 |
| 6,016,360 A | * | 1/2000 | Nguyen et al. ....... 382/166 |
| 6,073,154 A | * | 6/2000 | Dick .................. 708/401 |
| 6,384,838 B1 | * | 5/2002 | Hannah ............... 345/601 |
| 6,480,202 B1 | * | 11/2002 | Deguchi et al. ....... 345/600 |
| 6,483,343 B1 | * | 11/2002 | Faith et al. ........... 326/40 |

(Continued)

FOREIGN PATENT DOCUMENTS

EP    0 457 297 A    11/1991

(Continued)

OTHER PUBLICATIONS

D. Friedman et al. (Theory & Design of switching circuits) ISBN# 0-914894-52-8 19975 pp. 37-57.*

(Continued)

*Primary Examiner*—Javid A Amini
(74) *Attorney, Agent, or Firm*—McAndrews, Held & Malloy, Ltd.

(57) ABSTRACT

A method and system are disclosed for decimating an indexed set of data elements to generate a decimated set of data elements. The indexed set of data elements are grouped into groups of at least two data elements per group. The indexes of the data elements in each group are used to address a look-up-table (LUT) that is pre-programmed to perform the decimation operation. For each group of data elements presented to address the LUT, a decimated data value is output from the LUT. The decimated data value is a function of the data values of the corresponding data elements addressing the LUT.

108 Claims, 4 Drawing Sheets

U.S. PATENT DOCUMENTS

| | | | |
|---|---|---|---|
| 6,507,860 B1* | 1/2003 | Verma et al. | 708/404 |
| 6,618,500 B1* | 9/2003 | Dawson | 382/162 |
| 6,747,644 B1* | 6/2004 | Deering | 345/420 |
| 6,801,672 B1* | 10/2004 | Thomas | 382/275 |
| 6,958,772 B1* | 10/2005 | Sugimori | 348/222.1 |
| 7,076,595 B1* | 7/2006 | Dao et al. | 710/317 |
| 7,099,420 B2* | 8/2006 | Lee et al. | 375/350 |
| 7,196,648 B1* | 3/2007 | Ding et al. | 341/144 |
| 2001/0035976 A1* | 11/2001 | Poon | 358/1.15 |
| 2002/0006229 A1* | 1/2002 | Chao et al. | 382/240 |
| 2002/0191104 A1* | 12/2002 | Matsutani et al. | 348/441 |
| 2003/0058250 A1* | 3/2003 | Adams et al. | 345/589 |
| 2003/0060918 A1* | 3/2003 | West et al. | 700/133 |
| 2007/0005795 A1* | 1/2007 | Gonzalez | 709/232 |
| 2007/0242085 A1* | 10/2007 | Weybrew et al. | 345/629 |

FOREIGN PATENT DOCUMENTS

| | | |
|---|---|---|
| EP | 0 774 856 A | 5/1997 |

OTHER PUBLICATIONS

John W. Lockwood, Naji Naufel, Jon S. Turner, David E. Taylor, Reprogrammable Network Packet Processing on the Field Programmable Port Extender (FPX) ,FPGA 2001 Feb. 11-12, 2001.*

An Iterative Area/Performance Trade-Off Algorithm for LUT-Based FPGA Technology Mapping, Juinn-Dar Huang, Jing-Yang Jou, and Wen-Zen Shen,1996 IEEE.*

Progressive Compression for Lossless Transmission of Triangle Meshes, Pierre Alliez_Mathieu Desbrun, ACM SIGGRAPH 2001, Aug. 12-17, 2001.*

"Computer-to-Display Interface For Real Time Conversion Of A High-Resolution Binary Image Into A Lower Resolution Grey Level Image" Research Disclosure, Kenneth Mason Publications, Hampshire, Great Britain, No. 335, Mar. 1, 1992, pp. 175-176; XP000300942; ISSN: 0374-4353.

Summons to Oral Proceedings pursuant to Rule 115(1) EPC corresponding to European Application No. 03018309.9-2215, dated Sep. 17, 2009.

* cited by examiner

METHOD AND SYSTEM FOR DECIMATING AN INDEXED SET OF DATA ELEMENTS

BACKGROUND OF THE INVENTION

Embodiments of the present invention relate generally to a method and system for performing data decimation, and more particularly for decimating along at least one dimension of an array of video pixels in a video processing system and/or graphics subsystem.

Decimation of a frame of pixels to scale the frame is a common function in a video processing system. In particular, decimation along the horizontal dimension of the frame is often performed.

Typically, the decimation function is performed in hardware using a digital filter to effectively collapse groups of two or more pixels, along the horizontal dimension of the frame of pixels, into a single pixel per group. The digital filter is often implemented using hardware elements such as multipliers, adders, and multiplexers.

For example, a 2-tap digital filter is commonly used to average pairs of pixels to accomplish 2-to-1 decimation. Such traditional hardware implementations may be inflexible and limit the types of decimation that may be performed and the types of video formats that may be used such as, for example, the YUVA digital video format.

It is desirable to have a more flexible, programmable architecture that may handle many types of decimation formats including integer decimation, non-integer decimation, simple averaging, complex digital filtering, etc.

Further limitations and disadvantages of conventional and traditional approaches will become apparent to one of skill in the art, through comparison of such systems with embodiments of the present invention as set forth in the remainder of the present application with reference to the drawings.

BRIEF SUMMARY OF THE INVENTION

Certain embodiments of the present invention provide a method and system for decimating an indexed set of data elements.

A method of the present invention provides for decimating an indexed set of data elements to generate a decimated set of data elements. The indexed set of data elements are arranged into groups of at least two data elements per group. The indexes of the data elements in each group are used to address a look-up-table (LUT) that is pre-programmed to perform the decimation operation. For each group of data elements presented to address the LUT, a decimated data value is output from the LUT. The decimated data value is a function of the data values of the corresponding data elements addressing the LUT.

A system of the present invention provides a memory module storing an indexed set of data elements and a programmable memory device storing a decimation look-up-table (LUT). At least one FIFO is used to pipeline at least two sets of index values from the memory module to address lines of the programmable memory device. A host processor generates the decimation LUT according to a decimation algorithm and downloads the decimation LUT to the programmable memory device. The programmable memory device outputs a set of decimation data values as the programmable memory device is addressed by the at least two sets of index values corresponding to said indexed set of data elements.

Certain embodiments of the present invention afford an approach for decimating along at least one dimension of an array of pixels in a video processing system by indexing into a pre-programmed decimation LUT.

These and other advantages and novel features of the present invention, as well as details of an illustrated embodiment thereof, will be more fully understood from the following description and drawings.

DETAILED DESCRIPTION OF THE INVENTION

Figure 1:
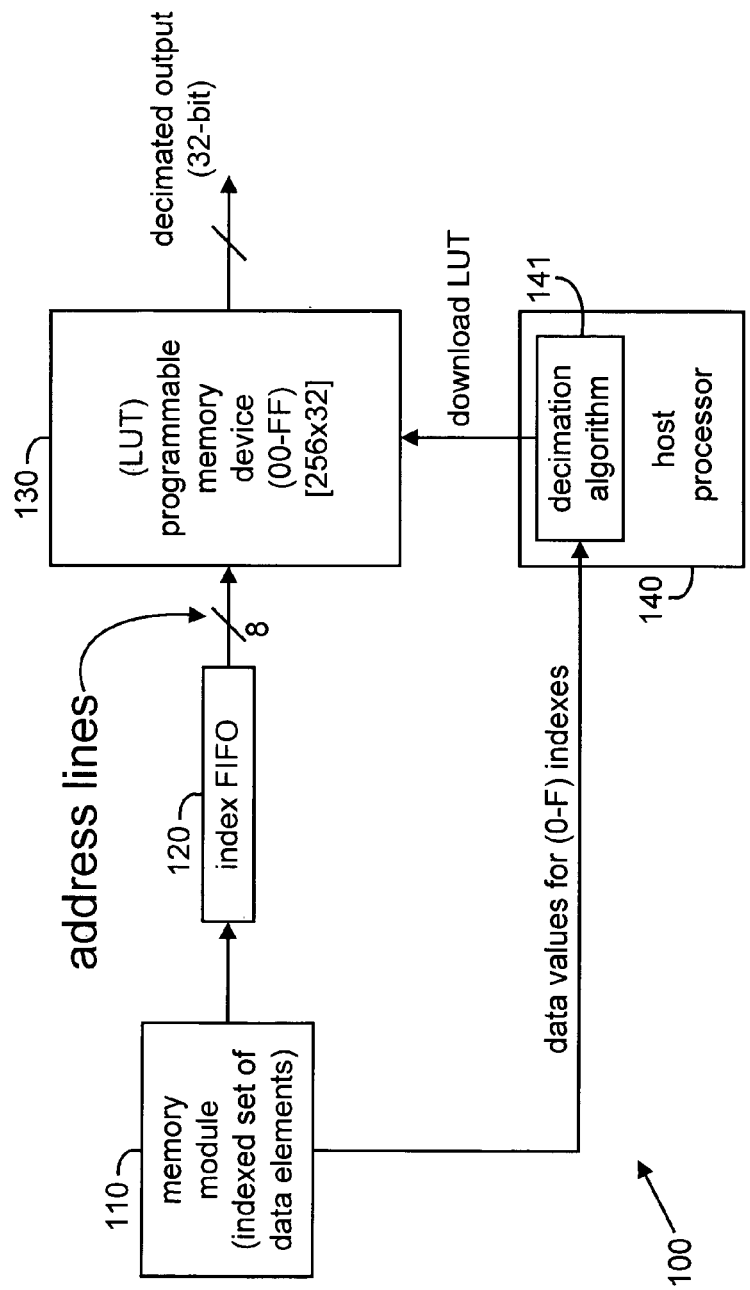
FIG. 1 is a schematic block diagram of a system for decimating an indexed set of data elements in accordance with an embodiment of the present invention.

FIG. 1 is a schematic block diagram of a system 100 for decimating an indexed set of data elements in accordance with an embodiment of the present invention. The system 100 comprises a memory module 110, a FIFO 120, a programmable memory device 130, and a host processor 140.

In accordance with an embodiment of the present invention, the memory module 110 interfaces to the input of the FIFO 120. The output of the FIFO 120 interfaces to the address inputs of the programmable memory device 130. The host processor 140 interfaces to the programmable memory device 130 and the memory module 110.

The memory module 110 stores an indexed set of data elements such as a frame of video pixel data. The memory module 110 may store a single frame of video pixel data or multiple frames of video pixel data. Associated with each element of the indexed set of data elements is an index value and a data value stored in memory module 110.

Figure 2:
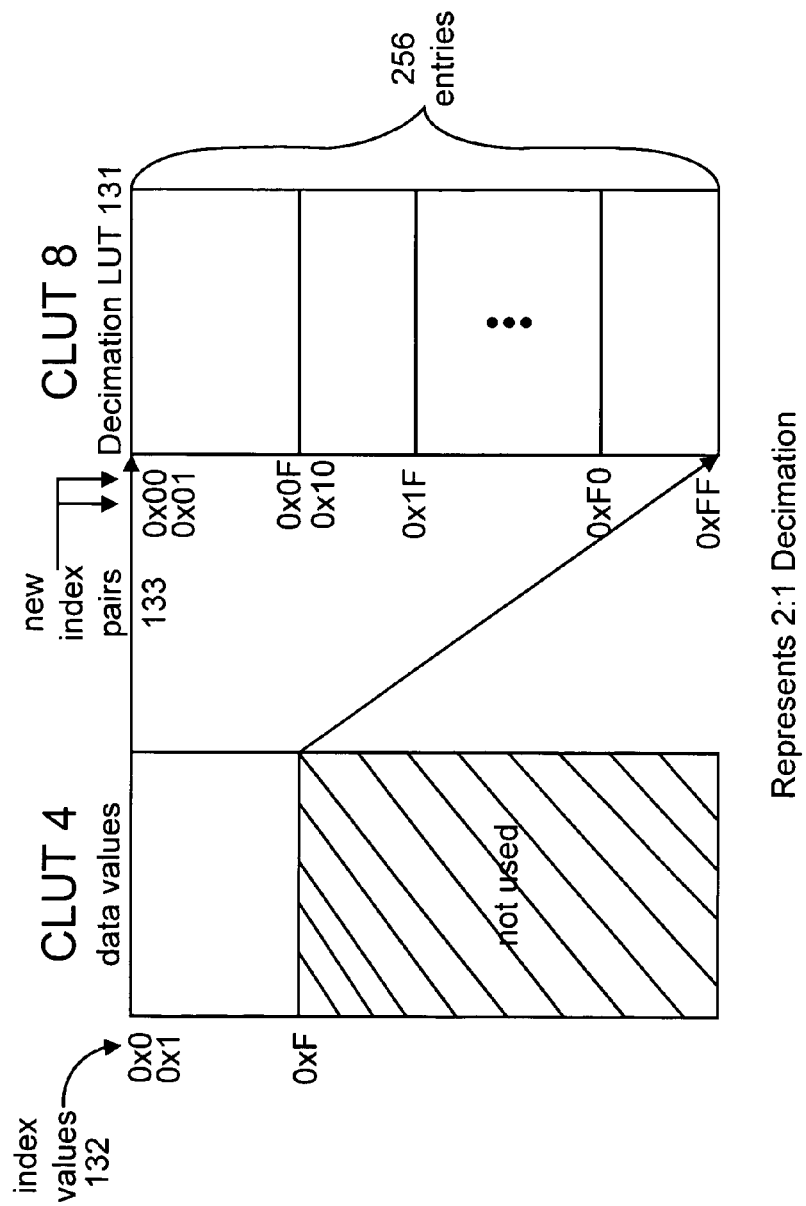
FIG. 2 is an exemplary illustration of generating a decimation LUT from an initial set of indexed data values in accordance with an embodiment of the present invention.

Referring to FIG. 2, in an embodiment of the present invention, each element in the indexed set of data elements may take on one of 16 possible data values and each possible data value has a unique index value (0x0 to 0xF in hex).

Figure 3:
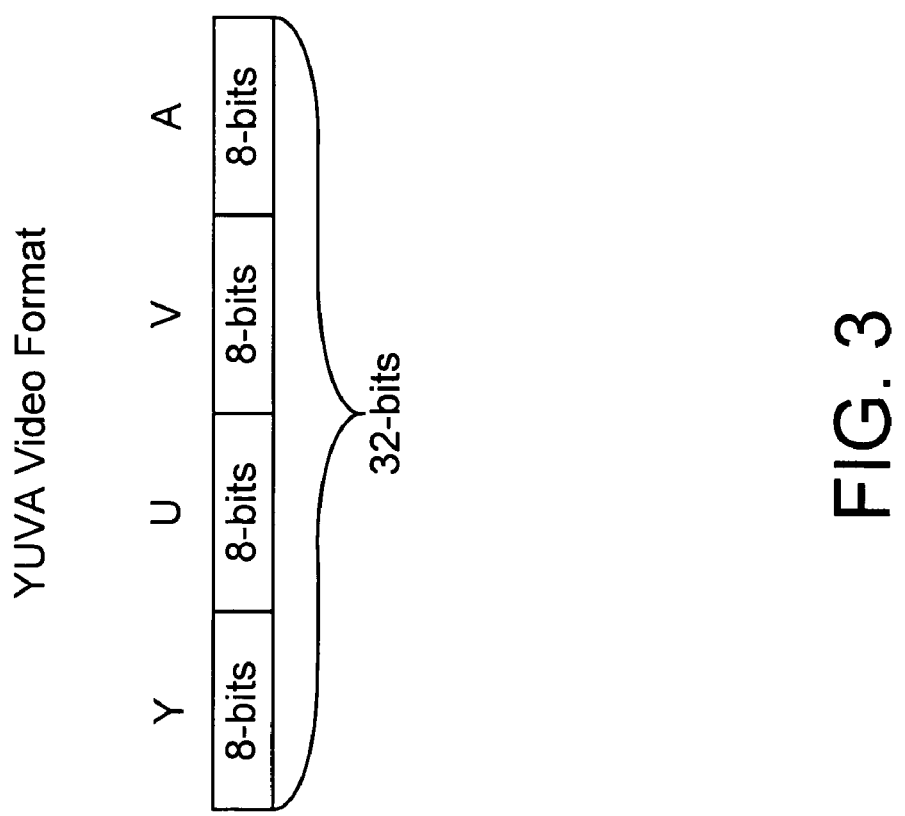
FIG. 3 is an illustration of the YUVA video format that is used in accordance with an embodiment of the present invention.

In an embodiment of the present invention, the data values represent colors in a YUVA video format (see FIG. 3). Each data value comprises a 32-bit word and each 32-bit word comprises 4 components of 8 bits each. The first 8-bit component corresponds to the Y component and represents the luminance of the color. The second 8-bit component corresponds to the U component and represents the color difference (blue) of the color. The third 8-bit component corresponds to the V component and represents the color difference (red) of the color. The fourth 8-bit component corresponds to the A component and represents the alpha value of the color. In other embodiments of the present invention, other video formats such as, for example, RGB, YUV, or RGBA may be used.

In an embodiment of the present invention, under the control of host processor 140, the memory module 110 pipelines index values of the indexed set of data elements to FIFO 120 as grouped pairs of index values. Each index value comprises 4 bits (corresponding to one of the 16 possible data values or colors). Each pair of index values output from the FIFO 120 serve as an address to programmable memory device 130. For each address presented to programmable memory device 130, a decimated output value (32-bits) is output from programmable memory device 130 in the YUVA format. In an embodiment of the present invention, the programmable memory device comprises a SRAM. As all the pairs of index values are pipelined through the FIFO 120, a decimated set of data elements is formed.

Figure 4:
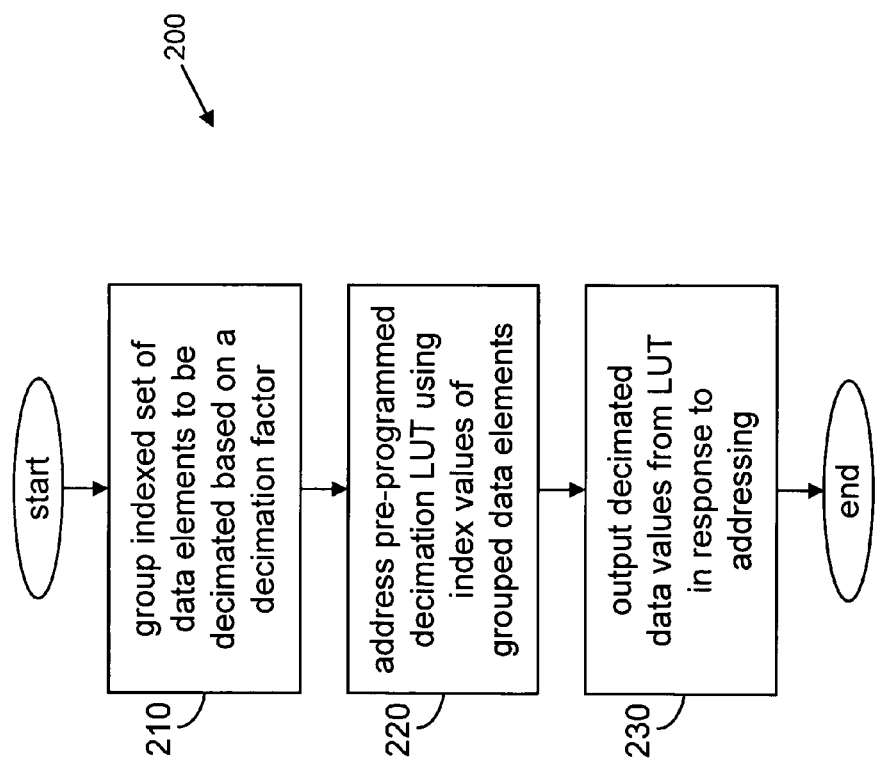
FIG. 4 is a flowchart of a method for performing decimation of an indexed set of data elements using the system of FIG. 1 in accordance with an embodiment of the present invention.

Referring to FIG. 4, in step 210 of method 200, the indexed set of data elements are grouped based on a decimation factor (2:1, 3:2, 3:1, etc.). In step 220, the index values of the grouped data elements are pipelined through the FIFO 120 to address a decimation look-up-table (LUT) stored in programmable memory device 130. For each grouped pair of index values addressing the decimation LUT, the programmable memory device 130 outputs a decimation output value in step 230.

The decimated output values are a function of the decimation LUT stored in programmable memory device 130. In an embodiment of the present invention, the decimation LUT is generated from the 16 possible data values indexed by 0x0 to 0xF hex (CLUT 4 data) (see FIG. 2). A decimation algorithm 141 in host processor 140 is used to generate the decimation LUT.

Referring to FIG. 2, in an embodiment of the present invention, a decimation LUT 131 (CLUT 8) having 256 32-bit entries may be generated to allow, for example, 2-to-1 decimation of the indexed set of data elements. Any two data elements of the indexed set of data elements may be grouped together and collapsed into a single data element using the decimation LUT 131 and the index values 132 of the 16 possible data values.

For example, if a first data element has index value 0x3 and a second data element has index value 0xF, then a new address or index value 133 may be formed as 0x3F which is the combination of the two index values. The new index value 0x3F may serve as one of the 256 address locations in the decimation LUT. The 32-bit value stored in address 0x3F of the decimation LUT may be, for example, the simple average of the data values corresponding to index value 0x3 and index value 0xF. As a result, all 256 entries of the decimation LUT may be generated by averaging the data values from all of the possible combinations of the 16 original possible data values with index values 132 (0x0 to 0xF). As pairs of index values 133 of the indexed set of data elements are presented as addresses to programmable memory device 130, decimated output values are generated corresponding to the average of the data values of the pairs of index values.

The effective decimation factor depends on the way the elements of the indexed set of data elements are grouped. For example, in an embodiment of the present invention, if the data elements are simply grouped as pairs with each data element appearing in just one group, then 2-to-1 decimation is achieved. That is, every grouped pair is collapsed into a single output data element. For example, for four adjacent pixels in the indexed set of data elements (P1, P2, P3, and P4), then [P1, P2] may form a paired group and [P3, P4] may form a paired group. As a result, the decimation LUT outputs a decimation value for the group [P1, P2] and another decimation value for the group [P3, P4], thus collapsing four pixels into two pixels (i.e. 2-to-1 decimation).

Now, if data elements are grouped as pairs with any two adjacent groups sharing a data element, then 3-to-2 decimation is achieved. For example, for three adjacent pixels in the indexed set of data elements (P1, P2, and P3), then [P1, P2] may form a paired group and [P2, P3] may form a paired group. As a result, the decimation LUT outputs a decimation value for the group [P1, P2] and a decimation value for the group [P2, P3]. Therefore, for any three consecutive pixels in the indexed set of data elements, two decimated pixel values are output yielding 3-to-2 decimation.

In other embodiments of the present invention, other groupings may be achieved as well. For example, 3-to-1 decimation may be achieved if the indexed set of data elements are grouped into groups of three pixels each and the system architecture is designed to support three index values addressing the programmable memory device 130 (i.e. 4 address inputs per index value, etc.).

The decimation algorithm 141 may support many different groupings of data elements and decimation schemes. For example, in an embodiment of the present invention, the decimation algorithm 141 may be programmed to generate a decimation LUT that effectively performs low-pass filtering on groups of 3 data elements at a time to achieve 3-to-1 compression instead of just doing a simple averaging. Other complex functions may be applied as well in other embodiments.

Also, in an embodiment of the present invention, the decimation algorithm 141 may be programmed to process each component of the YUVA format separately. For example, if a simple averaging of pairs of pixels is performed to achieve 2-to-1 decimation, the averaging may be performed separately on each 8-bit component of the YUVA data elements such that no spill-over or overlap occurs between the various components.

Other embodiments of the present invention are not limited to the decimation of video pixel data. For example, an alternative embodiment of the present invention may be used to decimate an indexed set of data elements representing digital audio data.

The various elements of the system and method may be combined or separated according to various embodiments of the present invention. For example, the programmable memory device 130 may be separated into two programmable memory devices with each device being addressed by a single 4-bit index value pipelined from a single FIFO in accordance with an embodiment of the present invention (i.e. use two FIFO's).

Also, in accordance with an embodiment of the present invention, the programmable memory device 130 may not be programmed within system 100 by host processor 140. Instead, the programmable memory device 130 may be an EEPROM that is programmed before installation into the system 100.

In an alternative embodiment of the present invention, the memory module 110 may only store index values of the indexed set of data values and not the data values themselves. The relationship between the index values and the data values may be established offline outside of the system 100 and, therefore, the actual data values of the frames of video pixel data may not need to be stored in the system 100.

In a further alternative embodiment of the present invention, decimation may take place in two dimensions (e.g. horizontal and vertical) by using two FIFO's. A first FIFO may be used to pipeline horizontal groups of index values to the programmable memory device 130 and a second FIFO may be used to pipeline vertical groups of index values to the programmable memory device 130.

In summary, certain embodiments of the present invention afford an approach for decimating frames of video pixels in a video processing system by indexing into a pre-programmed decimation LUT.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. A method to decimate video pixels in a video processing system, said method comprising:
   arranging an indexed set of data elements into groups of at least two data elements;
   addressing a pre-programmed look-up-table (LUT) using at least two index values corresponding to said at least two data elements in each of said groups; and
   outputting a decimated data value from said LUT in response to each of said groups to generate a decimated set of data elements wherein said decimated data value comprises a filtered data value corresponding to said LUT being pre-programmed to filter data values of said at least two data elements.

2. The method of claim 1 further comprising pre-programming said LUT to output said decimated data value when addressed by said at least two index values.

3. The method of claim 1 wherein said indexed set of data elements is decimated by an integer factor to generate said decimated set of data elements.

4. The method of claim 1 wherein said indexed set of data elements is decimated by a non-integer factor to generate said decimated set of data elements.

5. The method of claim 1 wherein said decimated data value comprises an average data value corresponding to said LUT being pre-programmed to average data values of said at least two data elements.

6. The method of claim 1 wherein said decimated data value comprises at least two components, and wherein each of said at least two components is a function of corresponding components of data values of said at least two data elements.

7. The method of claim 1 wherein each data element of said at least two data elements comprises a data value in a YUVA format.

8. The method of claim 1 wherein said decimated data value is in a YUVA format.

9. The method of claim 1 wherein each index value of said at least two index values comprises 4 bits.

10. The method of claim 1 wherein said decimated data value comprises 32 bits.

11. The method of claim 1 wherein each data value of each of said at least two data elements comprises 32 bits.

12. The method of claim 1 wherein said decimated data value changes when at least one of said at least two index values changes.

13. The method of claim 1 wherein said indexed set of data elements is decimated along a horizontal dimension of said indexed set of data elements to generate said decimated set of data elements.

14. The method of claim 1 wherein said indexed set of data elements is decimated along a vertical dimension of said indexed set of data elements to generate said decimated set of data elements.

15. The method of claim 1 wherein said LUT comprises a programmable memory device.

16. The method of claim 1 wherein said LUT stores at least 256 decimated data values.

17. The method of claim 1 wherein said indexed set of data elements comprise video pixel data.

18. A method for decimating video pixels in a video processing system, said method comprising:
   grouping a number of data elements into a plurality of groups, wherein each of said data elements comprises a data value, said data value associated with a corresponding index value of one or more index values, said grouping based on a decimation factor;
   addressing a programmable memory using two or more of said index values to access a decimated value; and
   outputting said decimated value from said programmable memory, said decimated value computed using a decimation algorithm for computing an average data value of said data elements in each group of said plurality of groups, said decimation algorithm resident in a host processor.

19. The method of claim 18 wherein said index values are generated from a memory module and transmitted to said programmable memory using a first-in-first-out (FIFO) buffer.

20. The method of claim 18 wherein said number comprises 2.

21. The method of claim 18 wherein each of said index values comprises 4 bits.

22. The method of claim 18 wherein said data value comprises 32 bits.

23. The method of claim 18 wherein said decimation factor comprises an integer value.

24. The method of claim 23 wherein said integer value comprises 2.

25. The method of claim 23 wherein said decimation factor comprises a non-integer value.

26. The method of claim 25 wherein said non-integer value comprises 1.5.

27. The method of claim 18 wherein said data value comprises four 8 bit words configured in a YUVA video format.

28. The method of claim 18 wherein said data elements comprise video pixels from a horizontal dimension of a frame.

29. The method of claim 28 wherein said data elements comprise video pixels from a vertical dimension of a frame.

30. A system to decimate an indexed set of data elements, said system comprising:
   a memory module storing one or more data values and one or more corresponding index values of said indexed set of data elements;
   a programmable memory storing one or more decimated data values;
   at least one FIFO used to transmit pairs of said one or more corresponding index values from said memory module, each of said pairs used to address a decimated data value of said one or more decimated data values from said programmable memory; and
   a host processor containing a decimation algorithm wherein said decimation algorithm computes an average of data values associated with each pair of said pairs of said one or more corresponding index values.

31. The system of claim 30 wherein said programmable memory comprises an EEPROM.

32. A system to decimate an indexed set of data elements, said system comprising:
   a memory module storing said indexed set of data elements;
   a programmable memory device storing a decimation look-up-table (LUT);
   at least one FIFO to pipeline at least two sets of index values from said memory module to address lines of said programmable memory device; and a host processor to download said decimation LUT to said programmable memory device, wherein output values of said programmable memory device comprise filtered data values corresponding to said decimation LUT being pre-programmed to filter data values corresponding to said at least two sets of index values.

33. The system of claim 32 wherein said host processor includes a decimation algorithm used to generate said decimation LUT from a pre-defined set of indexed data values.

34. The system of claim 32 wherein said indexed set of data elements comprises video pixel data and corresponding index values.

35. The system of claim 32 wherein said at least two sets of index values correspond to groups of at least two data elements of said indexed set of data elements.

36. The system of claim 32 wherein said programmable memory device outputs a decimated data value when addressed by at least two index values from said at least two sets of index values.

37. The system of claim 32 wherein said indexed set of data elements is decimated by an integer factor to generate a decimated set of data elements.

38. The system of claim 32 wherein said indexed set of data elements is decimated by a non-integer factor to generate a decimated set of data elements.

39. The system of claim 32 wherein each index value of said at least two sets of index values comprises 4 bits.

40. The system of claim 32 wherein said programmable memory device outputs a 32-bit decimation value in a YUVA format when addressed by at least two index values from said at least two sets of index values.

41. The system of claim 32 wherein each data value corresponding to each data element of said indexed set of data elements comprises a 32-bit word in a YUVA format.

42. The system of claim 32 wherein said programmable memory device outputs a 32-bit decimation value that is a function of the data values corresponding to at least two index values from said at least two sets of index values.

43. The system of claim 32 wherein said indexed set of data elements is decimated along a horizontal dimension of said indexed set of data elements to generate a decimated set of data elements.

44. The system of claim 32 wherein said indexed set of data elements is decimated along a vertical dimension of said indexed set of data elements to generate a decimated set of data elements.

45. The system of claim 32 wherein said programmable memory device stores at least 256 32-bit decimation values.

46. The system of claim 32 wherein output values of said programmable memory device comprise averaged data values corresponding to said decimation LUT being pre-programmed to average data values corresponding to said at least two sets of index values.

47. A system to decimate an indexed set of data elements, said system comprising:
a memory module storing said indexed set of data elements;
a programmable memory device storing a decimation look-up-table (LUT);
at least one FIFO to pipeline at least two sets of index values from said memory module to address lines of said programmable memory device; and
a host processor to download said decimation LUT to said programmable memory device, wherein output values of said programmable memory device comprise averaged data values corresponding to said decimation LUT being pre-programmed to average data values corresponding to said at least two sets of index values.

48. The system of claim 47 wherein said host processor includes a decimation algorithm used to generate said decimation LUT from a pre-defined set of indexed data values.

49. The system of claim 47 wherein said indexed set of data elements comprises video pixel data and corresponding index values.

50. The system of claim 47 wherein said at least two sets of index values correspond to groups of at least two data elements of said indexed set of data elements.

51. The system of claim 47 wherein said programmable memory device outputs a decimated data value when addressed by at least two index values from said at least two sets of index values.

52. The system of claim 47 wherein said indexed set of data elements is decimated by an integer factor to generate a decimated set of data elements.

53. The system of claim 47 wherein said indexed set of data elements is decimated by a non-integer factor to generate a decimated set of data elements.

54. The system of claim 47 wherein each index value of said at least two sets of index values comprises 4 bits.

55. The system of claim 47 wherein said programmable memory device outputs a 32-bit decimation value in a YUVA format when addressed by at least two index values from said at least two sets of index values.

56. The system of claim 47 wherein each data value corresponding to each data element of said indexed set of data elements comprises a 32-bit word in a YUVA format.

57. The system of claim 47 wherein said programmable memory device outputs a 32-bit decimation value that is a function of the data values corresponding to at least two index values from said at least two sets of index values.

58. The system of claim 47 wherein said indexed set of data elements is decimated along a horizontal dimension of said indexed set of data elements to generate a decimated set of data elements.

59. The system of claim 47 wherein said indexed set of data elements is decimated along a vertical dimension of said indexed set of data elements to generate a decimated set of data elements.

60. The system of claim 47 wherein said programmable memory device stores at least 256 32-bit decimation values.

61. The system of claim 47 wherein output values of said programmable memory device comprise filtered data values corresponding to said decimation LUT being pre-programmed to filter data values corresponding to said at least two sets of index values.

62. A method comprising:
using an indexed set of data elements stored in a memory module;
storing a decimation look-up-table (LUT) in a programmable memory device;
using at least one FIFO to pipeline at least two sets of index values from said memory module to address lines of said programmable memory device; and
downloading said decimation LUT to said programmable memory device using a host processor, wherein output values of said programmable memory device comprise filtered data values corresponding to said decimation LUT being pre-programmed to filter data values corresponding to said at least two sets of index values.

63. The method of claim 62 wherein said host processor includes a decimation algorithm used to generate said decimation LUT from a pre-defined set of indexed data values.

64. The method of claim 62 wherein said indexed set of data elements comprises video pixel data and corresponding index values.

65. The method of claim 62 wherein said at least two sets of index values correspond to groups of at least two data elements of said indexed set of data elements.

66. The method of claim 62 wherein said programmable memory device outputs a decimated data value when addressed by at least two index values from said at least two sets of index values.

67. The method of claim 62 wherein said indexed set of data elements is decimated by an integer factor to generate a decimated set of data elements.

68. The method of claim 62 wherein said indexed set of data elements is decimated by a non-integer factor to generate a decimated set of data elements.

69. The method of claim 62 wherein each index value of said at least two sets of index values comprises 4 bits.

70. The method of claim 62 wherein said programmable memory device outputs a 32-bit decimation value in a YUVA format when addressed by at least two index values from said at least two sets of index values.

71. The method of claim 62 wherein each data value corresponding to each data element of said indexed set of data elements comprises a 32-bit word in a YUVA format.

72. The method of claim 62 wherein said programmable memory device outputs a 32-bit decimation value that is a function of the data values corresponding to at least two index values from said at least two sets of index values.

73. The method of claim 62 wherein said indexed set of data elements is decimated along a horizontal dimension of said indexed set of data elements to generate a decimated set of data elements.

74. The method of claim 62 wherein said indexed set of data elements is decimated along a vertical dimension of said indexed set of data elements to generate a decimated set of data elements.

75. The method of claim 62 wherein said programmable memory device stores at least 256 32-bit decimation values.

76. The method of claim 62 wherein output values of said programmable memory device comprise averaged data values corresponding to said decimation LUT being pre-programmed to average data values corresponding to said at least two sets of index values.

77. A method comprising:
using an indexed set of data elements stored in a memory module;
storing a decimation look-up-table (LUT) in a programmable memory device;
using at least one FIFO to pipeline at least two sets of index values from said memory module to address lines of said programmable memory device; and
downloading said decimation LUT to said programmable memory device using a host processor, wherein output values of said programmable memory device comprise averaged data values corresponding to said decimation LUT being pre-programmed to average data values corresponding to said at least two sets of index values.

78. The method of claim 77 wherein said host processor includes a decimation algorithm used to generate said decimation LUT from a pre-defined set of indexed data values.

79. The method of claim 77 wherein said indexed set of data elements comprises video pixel data and corresponding index values.

80. The method of claim 77 wherein said at least two sets of index values correspond to groups of at least two data elements of said indexed set of data elements.

81. The method of claim 77 wherein said programmable memory device outputs a decimated data value when addressed by at least two index values from said at least two sets of index values.

82. The method of claim 77 wherein said indexed set of data elements is decimated by an integer factor to generate a decimated set of data elements.

83. The method of claim 77 wherein said indexed set of data elements is decimated by a non-integer factor to generate a decimated set of data elements.

84. The method of claim 77 wherein each index value of said at least two sets of index values comprises 4 bits.

85. The method of claim 77 wherein said programmable memory device outputs a 32-bit decimation value in a YUVA format when addressed by at least two index values from said at least two sets of index values.

86. The method of claim 77 wherein each data value corresponding to each data element of said indexed set of data elements comprises a 32-bit word in a YUVA format.

87. The method of claim 77 wherein said programmable memory device outputs a 32-bit decimation value that is a function of the data values corresponding to at least two index values from said at least two sets of index values.

88. The method of claim 77 wherein said indexed set of data elements is decimated along a horizontal dimension of said indexed set of data elements to generate a decimated set of data elements.

89. The method of claim 77 wherein said indexed set of data elements is decimated along a vertical dimension of said indexed set of data elements to generate a decimated set of data elements.

90. The method of claim 77 wherein said programmable memory device stores at least 256 32-bit decimation values.

91. The method of claim 77 wherein output values of said programmable memory device comprise filtered data values corresponding to said decimation LUT being pre-programmed to filter data values corresponding to said at least two sets of index values.

92. A method to decimate video pixels in a video processing system, said method comprising:
arranging an indexed set of data elements into groups of at least two data elements;
addressing a pre-programmed look-up-table (LUT) using at least two index values corresponding to said at least two data elements in each of said groups; and
outputting a decimated data value from said LUT in response to each of said groups to generate a decimated set of data elements wherein said decimated data value comprises an average data value corresponding to said LUT being pre-programmed to average data values of said at least two data elements.

93. The method of claim 92 further comprising pre-programming said LUT to output said decimated data value when addressed by said at least two index values.

94. The method of claim 92 wherein said indexed set of data elements is decimated by an integer factor to generate said decimated set of data elements.

95. The method of claim 92 wherein said indexed set of data elements is decimated by a non-integer factor to generate said decimated set of data elements.

96. The method of claim 92 wherein said decimated data value comprises a filtered data value corresponding to said LUT being pre-programmed to filter data values of said at least two data elements.

97. The method of claim 92 wherein said decimated data value comprises at least two components, and wherein each of said at least two components is a function of corresponding components of data values of said at least two data elements.

98. The method of claim 92 wherein each data element of said at least two data elements comprises a data value in a YUVA format.

99. The method of claim 92 wherein said decimated data value is in a YUVA format.

100. The method of claim 92 wherein each index value of said at least two index values comprises 4 bits.

101. The method of claim 92 wherein said decimated data value comprises 32 bits.

102. The method of claim 92 wherein each data value of each of said at least two data elements comprises 32 bits.

103. The method of claim 92 wherein said decimated data value changes when at least one of said at least two index values changes.

104. The method of claim 92 wherein said indexed set of data elements is decimated along a horizontal dimension of said indexed set of data elements to generate said decimated set of data elements.

105. The method of claim 92 wherein said indexed set of data elements is decimated along a vertical dimension of said indexed set of data elements to generate said decimated set of data elements.

106. The method of claim 92 wherein said LUT comprises a programmable memory device.

107. The method of claim 92 wherein said LUT stores at least 256 decimated data values.

108. The method of claim 92 wherein said indexed set of data elements comprise video pixel data.

* * * * *